United States Patent [19]

Hosoya

[11] 4,052,679
[45] Oct. 4, 1977

[54] PHASE SHIFTING CIRCUIT

[75] Inventor: Nobukazu Hosoya, Osaka, Japan

[73] Assignee: Sanyo Electric Co. Ltd., Osaka, Japan

[21] Appl. No.: 678,637

[22] Filed: Apr. 14, 1976

[30] Foreign Application Priority Data

Apr. 14, 1975 Japan .................................. 50-931[U]

[51] Int. Cl.² ............................................. H03K 1/12
[52] U.S. Cl. .................................. 330/261; 328/155;
307/262; 330/252
[58] Field of Search ............... 328/155; 330/30 D, 29;
307/262

[56] References Cited

U.S. PATENT DOCUMENTS

| | | | |
|---|---|---|---|
| 3,309,538 | 3/1967 | Ashley et al. | 330/30 D |
| 3,610,955 | 10/1971 | Blaser et al. | 330/30 D |
| 3,656,008 | 8/1972 | Nakagomi | 330/30 D |
| 3,908,172 | 9/1975 | Aschermann et al. | 330/29 |

Primary Examiner—John S. Heyman
Attorney, Agent, or Firm—Armstrong, Nikaido & Marmelstein

[57] ABSTRACT

The present disclosure relates to a phase shifting circuit for shifting the phase of an alternating circuit, which comprises a series-connected circuit of a resistor, and a capacitor for passing the alternating signal therethrough, a pair of differential amplification circuits each connected with the resistor and the capacitor, and a transistor for combining two alternating signals obtained from the pair of differential amplification circuits each controlled by a constant current source, whereby the combined alternating signal obtained from the transistor is shifted for some degrees.

4 Claims, 5 Drawing Figures

PHASE SHIFTING CIRCUIT

The present invention relates to an improvement in a phase shifting circuit for use in electrical and electronic devices, such as a color television set.

Color television sets are generally provided with some types of phase shifting circuit for adjusting the phase of a color subcarrier wave, generally in 3.58MHz. The color subcarrier wave is used in a synchronous demodulator for detecting particular color signal from a combined signal having two color signals. In order to detect the particular color signal with accuracy, the phase of the subcarrier wave must exactly be synchronized with the phase of the particular color signal. Therefore, it is necessary to adjust the phase of the subcarrier wave accurately before feeding to the synchronous demodulator.

FIG. 1 shows a conventional phase shifting circuit employed in a color television circuit. The subcarrier wave or color subcarrier wave Sw is fed to the base of a transistor Q1. The applied subcarrier wave Sw is transmitted to the base of the transistor Q4 through two different passages. The first passage starts from the collector of the transistor Q1, and then leads, through the transistor Q3, to the base of the transistor Q4, while the second passage starts from the emitter of the transistor Q1, and then leads, through the capacitor C1, to the base of the transistor Q4. The phase of the subcarrier wave Sw1 arriving at the base of the transistor Q4 through the first passage delays for some degrees in relation to the control voltage applied to the bases of transistor Q2 and Q3, while the phase of the subcarrier wave Sw2 arriving at the base of the transistor Q4 through the second passage advances 90°.

The subcarrier waves Sw1 and Sw2 are combined with each other at the base of the transistor Q4 to form an adjusted subcarrier wave Sw3, which has the phase suitably shifted. It should be noted that the phase shifting circuit shown in FIG. 1 may be formed in IC (integrated circuit).

However, the conventional phase shifting circuit of the above described type has various disadvantages as mentioned below.

First, the signal voltage to be applied to the phase shifting circuit, i.e., to the base of the transistor Q1 should not include therein comparatively high direct voltage component, because the signal voltage to be applied to the base of the transistor Q1 must not go over the saturation voltage of the transistor Q1.

Secondly, the gain in the phase shifting circuit is restricted in a very narrow range, because of the values of resistors R1 and R2 and capacitor C1 which comprise the conventional phase shifting circuit, being fixed in a predetermined amount according to the phase shifting degree, thus resulting in less variation in design.

Thirdly, the direct voltage, i.e., bias voltage +Vc, applied to the capacitor C1 enforces the capacitance of the capacitor C1 to become smaller, when formed as a junction capacitance in the IC, thus the capacitor C1 must previously have comparatively large capacitance. A capacitor, formed in the IC and having such a large capacitance occupies large area in the IC, thus resulting in large size of IC.

And finally, the signal passing through the above described first passage is apt to be affected by the control voltage applied to the bases of the transistors Q2 and Q3 in such a manner that the change in the control voltage changes the amount of direct voltage component in the signal passing through the first passage, in relation to the direct voltage component present in the signal passing through the second passage.

Accordingly, a primary object of the present invention is to provide an improved phase shifting circuit which allows signal voltage to be applied to the phase shifting circuit in comparatively high voltage.

Another object of the present invention is to provide an improved phase shifting circuit of the above described type which does not change the direct current or voltage component between the two signals to be combined.

A further object of the present invention is to provide an improved phase shifting circuit of the above described type in which capacitor is not applied with bias voltage.

A still further object of the present invention is to provide an improved phase shifting circuit of the above described type which is stable in function, and simple in construction, and can readily be incorporated into an integrated circuit.

According to the present invention, the phase shifting circuit comprises a pair of differential amplification circuits and a phase shifting unit, having two electrical elements connected in series with different phase characteristics from each other. The first differential amplification circuit is connected with the first electrical element at the bases of two opposite transistors. In the same manner, the second differential amplification circuit is connected in parallel with the second electrical element at the bases of two opposite transistors.

When an alternating signal passes through the phase shifting element, the phase of the signal passing through the first electrical element is different from that of the signal passing through the second electrical element, due to the difference in the phase characteristics. Then, the signal having the first phase is transmitted through the first differential amplification circuit, while the same signal but having the second phase is transmitted through the second differential amplification circuit. These two signals are combined after the differential amplification circuits to obtain a signal having the phase between the first and the second phases. The phase of the obtained signal can be changed according to change of the amplitude in the two differential amplification circuits which change can be operated by a suitable constant current source connected to each of the differential amplification circuits.

These and other objects and features of the present invention will become apparent from the following description taken in conjunction with a preferred embodiment there of with reference to the accompanying drawings, wherein.

Figure 2:
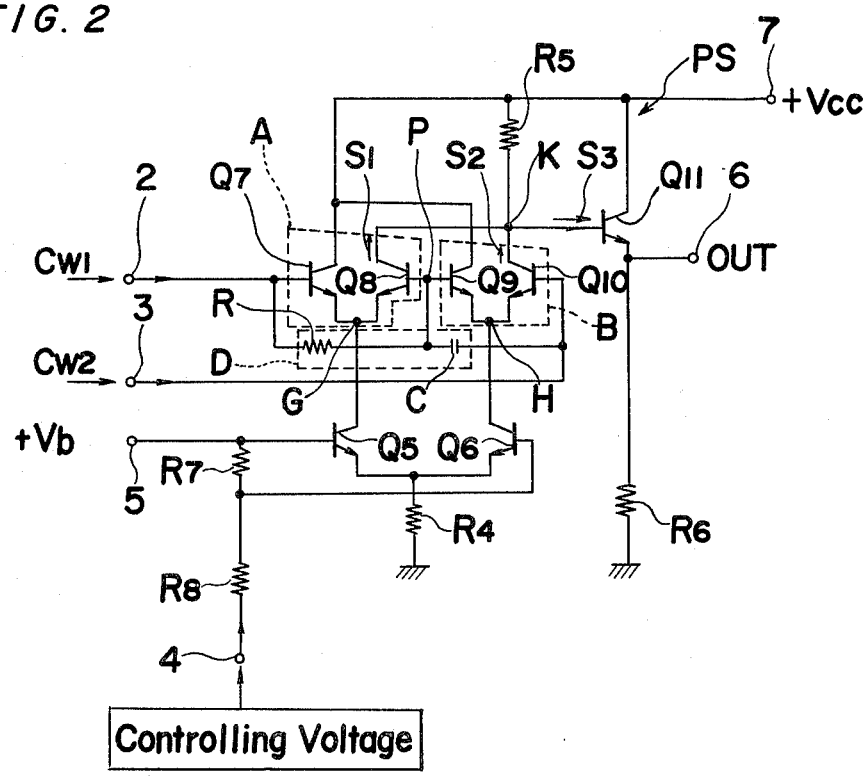
FIG. 2 is an electrical circuit diagram of a phase shifting circuit of the present invention.

Referring to FIG. 2, the phase shifting circuit PS comprises a pair of differential amplification circuits A and B and a phase shifting unit D. The first differential amplification circuit A comprises transistors Q7 and Q8, in which the emitters there of are connected to each other at a common junction G, and the base of the transistor Q7 is connected to a terminal 2 for receiving a carrier wave Cw1, while the base of the transistor Q8 is connected to a common junction P. In the similar manner, the second differential amplification circuit B comprises transistors Q9 and Q10, in which the emitters thereof are connected to each other at a common junction H, and the base of the transistor Q10 is connected to a terminal 3 for receiving the carrier wave Cw2, while the base of the transistor Q9 is connected to the common junction P, thus connecting the two differential circuits A and B between the bases of the transistors Q8 and Q9. A resistor R is inserted between the bases of the transistors Q7 and Q8, while a capacitor C is inserted between the bases of the transistors Q9 and Q10. These resistor R and capacitor C constitutes the phase shifting unit D. The common junction H and G are connected to the collector of a transistors Q5 and Q6, respectively. The emitter of the transistors Q5 and Q6 are connected to each other and are grounded through a suitable resistor R4. The base of the transistor Q5 is directly connected to a terminal 5 for receiving a bias voltage $+Vb$, while the base of the transistor Q6 is connected to the terminal 5 through a suitable resistor R7. A controlling voltage applied on a terminal 4 is further directed to the base of the transistor Q5 through resistors R8 and R7, and also to the base of the transistor Q6 through the resistor R8.

Referring back to the differential amplification circuits A and B, the collectors of the transistors Q8 and Q10 are connected to a base of a transistor Q11 through a common junction K, and the collectors of the transistors Q7 and Q9 are connected to the collector of the transistor Q11 and also to a terminal 7 which receives bias voltage $+Vcc$. A resistor R5 is further inserted between the common junction K and the collector of the transistor Q11. Emitter of the transistor Q11 is connected to an output terminal 6 of the phase shifting circuit PS and also is grounded through a resistor R6.

A function of the foregoing phase shifting circuit PS is described hereinbelow.

In order to operate the differential amplification circuits A and B, a suitable potential is applied to the bases of the transistors Q5 and Q6. The terminal 5 receives a suitable voltage $+Vb$ which is applied to the bases of the transistors Q5 and Q6, serving as constantcurrent source. The current balance between the transistors Q5 and Q6 is controlled by a control voltage applied to the terminal 4.

Applied to the terminals 2 and 3 are carrier waves Cw1 and Cw2 having a frequency of, for example, 3.58MHz. The phase of the carrier wave Cw2 delays 180° from that of the carrier wave Cw1.

When the current I flows from the terminal 2 to the terminal 3 through the resistor R and the capacitor C, the voltage drop across the resistor R has the same phase as that of the current I, while the voltage drop across the capacitor C advances 90° in comparison with that of the current I.

Figure 3:
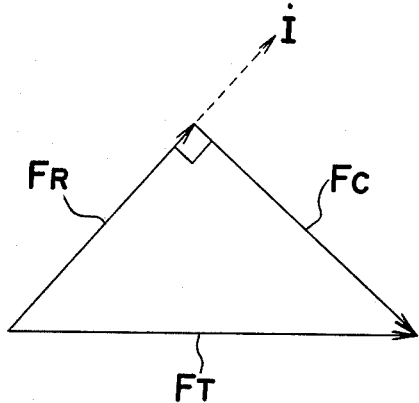
FIG. 3 shows a diagram of vectors for voltages across the electrical elements.

Referring to FIG. 3, vectors $F_R$, $F_C$ and $F_T$ correspond to the voltage drop across the resistor R, capacitor C and the phase shifting unit D, respectively, and a vector $\dot{I}$ corressponds to the current I. These voltage drops across the resistor R and capacitor C are applied to the differential amplification circuits A and B, respectively.

In the differential amplification circuit A, the current flowing through the collector of the transistor Q8 is controlled by the conductivity of the transistor Q5, thus a signal S1, which relates to the carrier wave Cw1 obtained from the collector of the transistor Q8, is in the same phase as that of the vector $F_R$, and the amplitude thereof is in relation to the conductivity of the transistor Q5. On the other hand, in the differential amplification circuit B, the current flowing through the collector of the transistor Q10 is controlled by the conductivity of the transistor Q6, thus a signal S2 which relates to the carrier wave Cw2 obtained from the collector of the transistor Q10 is in the same phase as that of the vector $F_C$, advancing 90° from the vector $F_R$, and the amplitude thereof is in relation to the conductivity of the transistor Q6. These two signals S1 and S2 are combined in one signal S3 at the common junction K.

Figure 4:
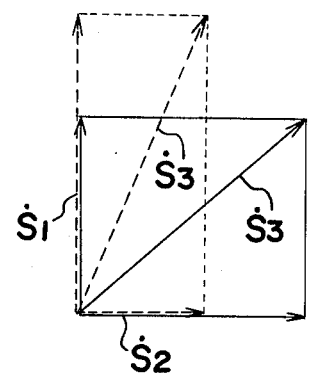
FIG. 4 shows a diagram of vectors for signals passing through the two differential amplification circuits.

Referring to FIG. 4, vectors $\dot{S}1$, $\dot{S}2$ and $\dot{S}3$ correspond to the signals S1, S2 and S3, respectively, particularly showing their amplitudes and their phases. Referring also to FIG. 2, when the control voltage applied to the terminal 4 sets the transistors Q5 and Q6 in the same condition, the conductivity of the transistors Q5 and Q6 affect the current flowing through the differential amplification circuits A and B, in such a manner that the amplitude of the signals S1 and S2 may result in the same amplitude as shown by the vectors $\dot{S}1$ and $\dot{S}2$, in real line, respectively. Therefore, the combined signal S3 is in a condition shown by the vector $\dot{S}3$, i.e., a sum of vectors $\dot{S}1$ and $\dot{S}2$.

On the other hand, when the control voltage sets the transistors Q5 and Q6 in another condition, the amplitude of the signal S1 and S2 may become greater and smaller, respectively, than foregoing condition. In this another condition, the vectors for the signals $\dot{S}1$, $\dot{S}2$ and $\dot{S}3$ shown in dotted line. In this case, the phase of the signal S3 is shifted for some degrees from the signal S3 in the first condition. Therefore, by changing the control voltage, it is possible to fix the phase of the signal S3 in a suitable phase between the phases of the signals S1 and S2.

The combined signal S3 is suitably amplified by the transistor Q11 and then obtained from the output terminal 6.

Since the bias voltages applied to the base of each of the transistors Q7, Q8, Q9 and Q10 are approximately equal in level, the voltage across the capacitor C is comparatively low, thus the capacitor C does not require large amount of capacitance.

Since the differential amplification circuits A and B are operated by the constant current source, i.e., by the transistors Q5 and Q6, the carrier wave to be applied to the terminals 2 and 3 can have comparatively high level of direct voltage component contained therein.

Figure 5:
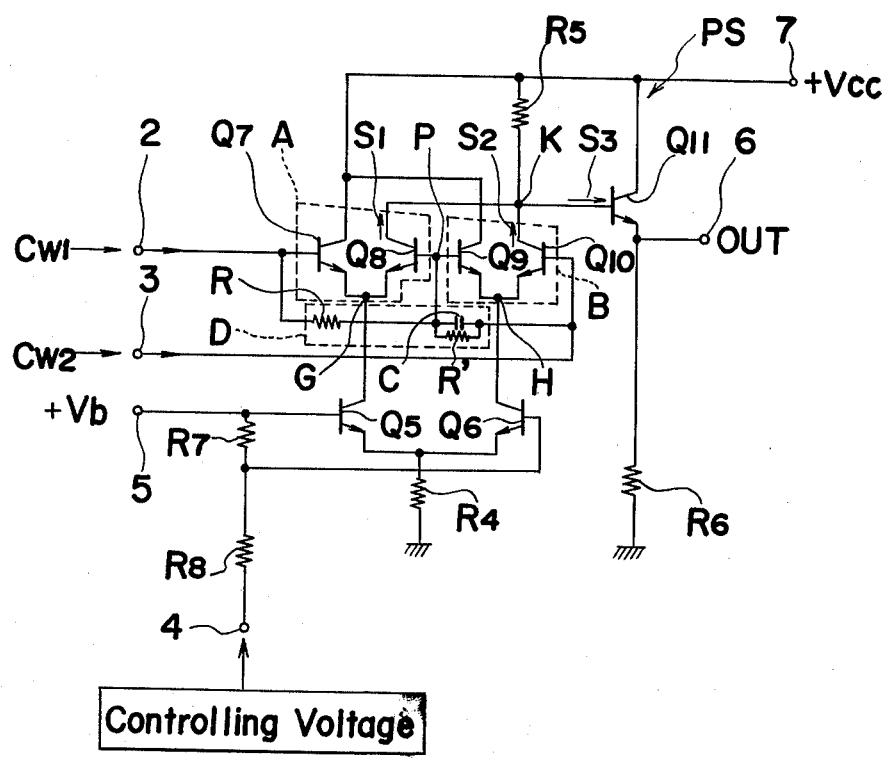
FIG. 5 is an electrical circuit diagram of a phase shifting circuit in another preferred embodiment.

It should be noted that the phase shifting unit D described as employed in the phase shifting circuit PS can be further provided with another resistor R', connected in parallel with the capacitor C, as shown in FIG. 5. In this case, the phase of the voltage drop across the parallel-connected capacitor C and the resistor R' may advance more than 90° from the phase of the voltage across the resistor R. Therefore, the phase of the signal S3 can be changed in more wider range than 90°.

Figure 1:
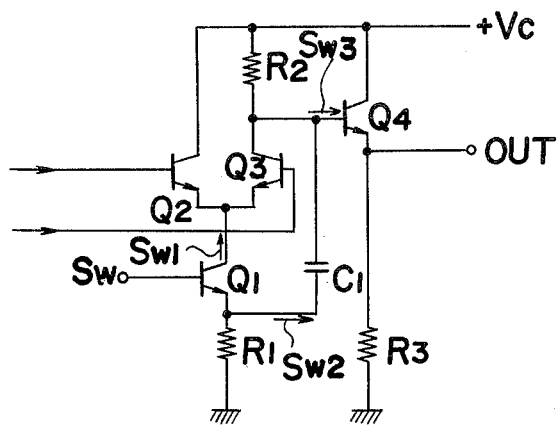

As is clear from the foregoing description, in the phase shifting circuit of the present invention, since the gain is determined by mutual conductance $gm$ of the pairs of differential transistors, ample gain is obtainable as compared with that of the conventional phase shifting circuit of FIG. 1, while the gain to be obtained can advantageously be adjusted through variation of the mutual conductance $gm$. Furthermore, since biasing voltage of approximately the same level is applied to the bases of the double balanced differential transistors Q7 to Q10, no biasing voltage is applied to the capacitor C of the phase shift unit D, thus making it possible to employ a capacitor of small capacity for the purpose, which arrangement is very effective for incorporating the phase shifting circuit into an integrated circuit from the view point of reduction of space occupied by a capacitor having large capacity. It is another advantage of the phase shifting circuit of the invention that the D.C. biasing voltage to be supplied to the terminals 2 and 3 for the color sub-carrier waves can be raised to a comparatively high level, since the load at the emitter side of the differential transistors is a constant-current source, thus connection of the phase shifting circuit to the color subcarrier supplying stage being readily effected.

Although the present invention has been fully described by way of example with reference to the accompanying drawings, it is to be noted that various changes and modifications are apparent to those skilled in the art. Therefore, unless such changes and modifications depart from the scope of the present invention, they should be construed as included therein.

What is claimed is:

1. A phase shifting circuit for shifting the phase of an alternating signal applied to thereto said phase shifting circuit comprising:
   a. a phase shifting means having two electrical elements connected in series, the phase characteristics of a first of the electrical elements being different from that of the second electrical element and wherein one of the electrical elements is a capacitive element, whereby the phase of said alternating voltage signal across the first electrical element is different from that across the second electrical element; and wherein input signals of opposite polarity are applied to each end of said serially connected electrical elements.
   b. a first differential circuit including first and second transistors interconnected at a first common terminal, and having first and second input terminals connected with said first electrical element for amplifying a first signal which is obtained from the voltage drop across said first electrical element;
   c. a second differential circuit including third and fourth transistors interconnected at a second common terminal, and having third and fourth input terminals connected with said second electrical element for amplifying a second signal which is obtained from the voltage drop across said second electrical element;
   d. means for combining said first signal from said first differential circuit with second signal from said second differential circuit;
   e. a constant current source means connected to each of said first common terminal and second common terminal, and connected to reference voltage point; and
   f. means for controlling a conductivity of said constant current source.

2. A phase shifting circuit as claimed in claim 1, wherein the other of said first and second electrical elements is a resistor.

3. A phase shifting circuit as claimed in claim 1, wherein said first electrical element is resistor and said second electrical element is resistor and capacitor being connected in parallel.

4. A phase shifting circuit as claimed in claim 1, wherein said phase shifting circuit is formed in an integrated circuit.

* * * * *